(12) United States Patent
Lev et al.

(10) Patent No.: US 8,092,922 B2
(45) Date of Patent: Jan. 10, 2012

(54) LAYERED COATING AND METHOD FOR FORMING THE SAME

(75) Inventors: Leonid C. Lev, West Bloomfield, MI (US); Michael J. Lukitsch, Marysville, MI (US); Yang T. Cheng, Troy, MI (US); Anita M. Weiner, West Bloomfield, MI (US); Robert F. Paluch, Allenton, MI (US); Neil E. Anderson, Novi, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 223 days.

(21) Appl. No.: 12/165,627

(22) Filed: Jun. 30, 2008

(65) Prior Publication Data
US 2009/0324937 A1  Dec. 31, 2009

(51) Int. Cl.
B32B 15/04 (2006.01)
(52) U.S. Cl. .......................... 428/627; 428/610
(58) Field of Classification Search .................. None
See application file for complete search history.

(56) References Cited

U.S. PATENT DOCUMENTS

| | | | |
|---|---|---|---|
| 4,486,285 A | 12/1984 | Aubert et al. | |
| 4,720,442 A | 1/1988 | Shinkai et al. | |
| 4,943,486 A * | 7/1990 | Uchiyama | 428/469 |
| 5,160,537 A | 11/1992 | Terrat et al. | |
| 5,449,547 A | 9/1995 | Miyazaki et al. | |
| 5,587,227 A | 12/1996 | Ooya | |
| 5,672,386 A | 9/1997 | Ooya | |
| 5,700,551 A | 12/1997 | Kukino et al. | |
| 6,060,182 A | 5/2000 | Tanaka et al. | |
| 6,492,011 B1 | 12/2002 | Brandle et al. | |
| 6,797,335 B1 * | 9/2004 | Paderov et al. | 427/530 |
| 2004/0005981 A1 | 1/2004 | Weber et al. | |
| 2005/0019613 A1 | 1/2005 | Misaki et al. | |
| 2009/0226715 A1 * | 9/2009 | Lev et al. | 428/336 |

FOREIGN PATENT DOCUMENTS

| | | |
|---|---|---|
| JP | 06/346239 | 12/1994 |
| JP | 11/029848 | 2/1999 |
| KR | 2000-0000793 | 1/2000 |
| KR | 10/0295611 | 10/2001 |

OTHER PUBLICATIONS

International Search Report for S. N. PCT/US2009/047316 dated Feb. 3, 2010 (3 pages).
Constantin et al., Metal/Semiconductor Phase Trans in Chromium Nitride (001) Grown by Rf-Plasma-Assist Molecular-Beam Epitaxy, APL, vol. 85, No. 26, Dec. 27, 2004, pp. 6371-6373.
Anderson et al., "Coatings for Automotive Planetary Gearsets", Proceedings of DETC'03, ASME 2003 Design Engineering Tech Conf., Sep. 2-6, 2003, pp. 1-10.

* cited by examiner

*Primary Examiner* — Aaron Austin
(74) *Attorney, Agent, or Firm* — Dierker & Associates, P.C.

(57) ABSTRACT

A layered coating is disclosed herein. The layered coating includes a chromium layer, an intermediate layer of chromium and nitrogen established on the chromium layer, and an outer layer of chromium and nitrogen established on the intermediate layer. The intermediate layer has a gradually changing composition, wherein the chromium concentration decreases from an area of the intermediate layer adjacent the chromium layer towards a surface of the layered coating.

11 Claims, 1 Drawing Sheet

LAYERED COATING AND METHOD FOR FORMING THE SAME

TECHNICAL FIELD

The present disclosure relates generally to layered coatings and a method for forming the same.

BACKGROUND

Transmission gears and other substantially heavily loaded mechanisms include, in some instances, a substrate formed from, e.g., steel or aluminum, where the substrate is coated with a $CrN_x$ coating material. The $CrN_x$ coating, which may include a mixture of CrN and $Cr_2N$, often advantageously improves the wear and corrosion resistance of the substrate. In some instances, however, the $CrN_x$ coating insufficiently adheres to the substrate and/or the $CrN_x$ coating may have a substantially high residual stress, which may lead to delamination of the $CrN_x$ coating from the substrate.

One way of improving the adherence of the coating material on the steel substrate is to use substantially pure Cr as the coating material. It has been found, however, that substantially pure Cr may be deficient in hardness and may not improve the wear and corrosion resistance of the steel substrate.

SUMMARY

A layered coating is disclosed herein. The layered coating includes a chromium layer, an intermediate layer of chromium and nitrogen established on the chromium layer, and an outer layer of chromium and nitrogen established on the intermediate layer. The intermediate layer has a gradually changing composition, wherein the chromium concentration decreases from an area of the intermediate layer adjacent the chromium layer towards a surface of the layered coating.

BRIEF DESCRIPTION OF THE DRAWING

Features and advantages of embodiments of the present disclosure will become apparent by reference to the following detailed description and drawing.

DETAILED DESCRIPTION

Figure 1:
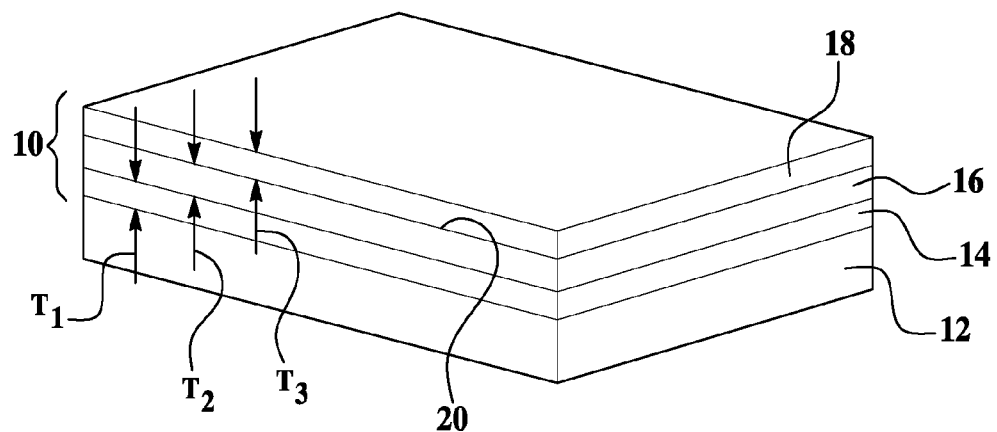
FIG. 1 is a semi-schematic perspective view of an embodiment of the layered coating established on a substrate.

Embodiments of the layered coating disclosed herein advantageously improve the performance of heavily loaded mechanisms with respect to wear and/or corrosion resistance. The layered coating includes a substantially pure chromium layer, an intermediate layer of chromium and nitrogen having a gradually changing composition established on the substantially pure chromium layer, and an outer layer of chromium and nitrogen established on the intermediate layer. Without being bound to any theory, it is believed that the durability and torque handling capacity of gears and other like objects that are coated with the layered coating may be substantially increased.

Referring now to FIG. 1, an embodiment of the layered coating 10 is established on a substrate 12. Generally, the layered coating 10 is established on at least a portion of the substrate surface, and has a total thickness ranging from about 1.02 µm to about 5 µm.

It is to be understood that any suitable substrate 12, upon which the layered coating 10 is established, may be selected. Non-limiting examples of suitable materials for such substrates include steel, various compositions of steel, aluminum, aluminum alloys, magnesium, magnesium alloys, and combinations thereof. In an embodiment, the substrate 12 is a steel composition having a carbon content ranging from about 0.2 wt % to about 1.0 wt %. The substrate 12 may also be a tool or other object having any desirable shape, geometry, and/or configuration. In a non-limiting example, the substrate 12 is a transmission gear, a hypoid gear of a rear axle differential mechanism, and/or the like.

As depicted in FIG. 1, the layered coating 10 includes three sub-layers 14, 16, 18. While the sublayers 14, 16, 18 are shown as three separate layers, it is to be understood that, generally, the layers 14, 16, 18 will be compatible at the respective interfaces, and thus a clear visual distinction between the layers 14, 16, 18 may not be discernable.

The sub-layer of the coating 10 established directly adjacent to the substrate 12 is a chromium layer 14. Generally, the chromium layer 14 has a thickness $T_1$ ranging from about 0.01 µm to about 0.5 µm.

An intermediate layer 16 is established on the chromium layer 14 at a thickness $T_2$ ranging from about 0.01 µm to about 0.5 µm.

The intermediate layer 16 has a gradually changing composition of chromium and nitrogen throughout its thickness $T_2$. Generally, the composition of the intermediate layer 16 is substantially composed of chromium at an area of the intermediate layer 16 that is directly adjacent the chromium layer 14. The chromium concentration in the intermediate layer 16 decreases towards a surface 20 of the intermediate layer 16. In an embodiment, the composition of the intermediate layer 16 changes from chromium, to $Cr_2N$, to CrN throughout the thickness $T_2$.

FIG. 1 also depicts an outer layer 18 of chromium and nitrogen established on the intermediate layer 16. The outer layer 18 is formed of chromium and nitrogen having an atomic ratio of about 1:1+/−2%. Generally, the outer layer 18 is established to have a thickness $T_3$ ranging from about 1 µm to about 4 µm.

In an embodiment of the method of forming the layered coating 10, the substrate 12 is added to a vacuum chamber, which is evacuated to a predetermined pressure. Generally, the predetermined pressure is a base pressure, which is less than about $4\times10^{-6}$ torr. In a non-limitative example, the predetermined pressure ranges from about $1\times10^{-6}$ torr to about $1\times10^{-5}$ torr.

Prior to adding the substrate 12 to the vacuum chamber, the substrate 12 may be mechanically cleaned, for example, with detergent and brushes. Once in the vacuum chamber, the substrate 12 may be further cleaned using a substantially mild argon etch at a desirable pressure (e.g., from about $1\times10^{-3}$ torr to about $5\times10^{-3}$ torr) and for a desirable time (e.g., from about 10 minutes to about 30 minutes). It is to be understood that the cleaning time may extend for a longer period so long as the temperature of the substrate 12 is substantially controlled such that the substrate 12 does not overheat. In a non-limiting example, the cleaning time may extend for a time period until the temperature of the substrate 12 reaches about 150° C., and at most, about 180° C. In the event that the substrate 12 overheats (i.e., exceeds 180° C.) and the desired cleaning level is not achieved, the cleaning process may be stopped and the substrate 12 may be allowed to cool (e.g., to a temperature below 180° C., and in some instances below 150° C.). Once the substrate 12 is cooled, the cleaning process may then resume. During the argon etch cleaning process, it is also to be understood that the substrate 12 may be biased to about −400V.

The method further includes energizing a chromium target within the chamber. This results in the sputtering of chromium particles. At least some of the particles adhere to the substrate 12 surface, thereby forming the chromium layer 14. The sputtering of the chromium particles on the substrate 12 surface may take place for a predetermined time. The time is determined, at least in part, on the desired thickness $T_1$ for the chromium layer 14. In an embodiment, the chromium particles are sputtered onto the substrate 12 for a time ranging from about 3 minutes to about 5 minutes.

After the predetermined time has passed, a predetermined level of a nitrogen gas flow is introduced into the chamber. Nitrogen gas flow may be controlled via a piezo-actuated valve, or other like valve mechanism. At least some of the chromium particles on the substrate 12 react with the nitrogen gas flow to form a chromium nitrogen layer (i.e., intermediate layer 16) on the chromium layer 14. The nitrogen gas flow is increased gradually, thereby decreasing the chromium content near the surface 20 of the chromium nitrogen layer 16. In a non-limiting example, the nitrogen content is gradually increased from 0 SCCM to about 10 SCCM over a time frame ranging from about 3 minutes to about 10 minutes, and thereafter is substantially maintained at about 10 SCCM.

The nitrogen gas flow is ultimately maintained at about 40% of the predetermined level. It is believed that this forms the outer layer 18 having an atomic ratio of chromium to nitrogen of 1:1+/−2% on the chromium nitrogen layer 16.

Prior to introducing the nitrogen gas flow into the chamber, the chromium particles produce an optical emission. Upon introduction of the nitrogen gas flow, the optical emission of the chromium atoms decreases approximately linearly with an increase in the nitrogen gas flow.

In a non-limitative example embodiment of the method, the coating sub-layers 14, 16, 18 are deposited or otherwise established on the substrate 12 using an unbalanced magnetron sputtering technique, such as that used in a Teer 550 UDM machine, manufactured by Teer Coatings, Ltd., Droitwich, Worcestershire, England.

To further illustrate embodiment(s) of the present disclosure, an example is given herein. It is to be understood that this example is provided for illustrative purposes and is not to be construed as limiting the scope of the disclosed embodiment(s).

EXAMPLE

A plurality of vehicle transmission gears was prepared via machining low-carbon steel having a carbon content of about 0.2%. The machining processes used included a hobbing process and a shaving process. After machining, the gears were carburized, case-hardened, and heat treated until the gears had a surface hardness ranging from about 58 to about 62, measured in terms of Rockwell Hardness (HRc). More specifically, the gears were placed in contact with a carburizing gas at a temperature of about 1700° F. (950° C.) to diffuse carbon atoms into the surface of the gears. It is to be understood that this temperature enables the steel structure to convert to austenite, which is suitable for carbon diffusion. The gears were hardened by forming carbide precipitates therein (often referred to as "carbides"). The gears were then cleaned via washing, and were loaded into a vacuum chamber.

Inside the vacuum chamber, the gears were then coated with a layer of Cr having a thickness of about 1 μm. An intermediate layer having a thickness of about 1 μm was then coated on the Cr layer. The intermediate layer was formed from a composition of $Cr_2N$ and CrN. An outer layer having a thickness of about 1 μm was then coated on the intermediate layer. The outer layer was formed from CrN having a Cr:N ratio of 1:1 (+/−2%).

A plurality of uncoated transmission gears was also prepared via machining low-carbon steel having a carbon content of about 0.2%. The machining processes also included a hobbing process and a shaving process. Thereafter, the gears were carburized and heat treated until they each had a surface hardness ranging from about 58 to about 62, measured in terms of Rockwell Hardness (HRc). The gears were then cleaned via washing. These gears remained uncoated.

The contact fatigue resistance of the coated and the uncoated vehicle transmission gears was tested. The testing protocol is described in N. Anderson and L. Lev, "Coatings for Automotive Planetary Gearsets," Proceedings of DETC'03, ASME 2003 Design Engineering Technical Conferences and Computers and Information in Engineering Conference, Chicago, Ill., Sep. 2-6, 2003, which is herein incorporated by reference in its entirety.

The results of the contact fatigue resistance test showed that the coated gears (formulated according to embodiments disclosed herein) could withstand a testing torque schedule corresponding to the performance of a 350 HP internal combustion engine. The uncoated gears tested under the same conditions, however, could withstand a testing torque schedule corresponding to the performance of no more than a 200 HP engine.

While several embodiments have been described in detail, it will be apparent to those skilled in the art that the disclosed embodiments may be modified. Therefore, the foregoing description is to be considered exemplary rather than limiting.

The invention claimed is:

1. A layered coating, comprising:
   a chromium layer;
   an intermediate layer of chromium and nitrogen established on the chromium layer, the intermediate layer having a gradually changing composition throughout its thickness wherein a chromium concentration decreases from an area of the intermediate layer adjacent the chromium layer towards a surface of the intermediate layer; and
   an outer layer of chromium and nitrogen established on the intermediate layer.

2. The layered coating as defined in claim 1 wherein the outer layer has an atomic ratio of chromium to nitrogen of 1:1+/−2%.

3. The layered coating as defined in claim 1 wherein the gradually changing composition of the intermediate layer changes from Cr to $Cr_2N$ to CrN.

4. The layered coating as defined in claim 1 wherein the chromium layer has a thickness ranging from about 0.01 μm to about 0.5 μm.

5. The layered coating as defined in claim 1 wherein the thickness of the intermediate layer ranges from about 0.01 μm to about 0.5 μm.

6. The layered coating as defined in claim 1 wherein the outer layer has a thickness ranging from about 1 μm to about 4 μm.

7. An apparatus, comprising:
   a substrate; and
   a layered coating established on at least a portion of a surface of the substrate, the layered coating including:
   a chromium layer established on the substrate surface;
   an intermediate layer of chromium and nitrogen established on the chromium layer, the intermediate layer having a gradually changing composition throughout its thickness wherein a chromium concentration decreases from an area of the intermediate layer adjacent the chromium layer towards a surface of the layered coating; and an outer layer of chromium and nitrogen established on the intermediate layer.

8. The apparatus as defined in claim 7 wherein the outer layer has an atomic ratio of chromium to nitrogen of 1:1+/−2%.

9. The apparatus as defined in claim 7 wherein the gradually changing composition of the intermediate layer changes from Cr to $Cr_2N$ to CrN.

10. The apparatus as defined in claim 7 wherein the chromium layer has a thickness ranging from about 0.01 μm to about 0.5 μm; the thickness of the intermediate layer ranges from about 0.01 μm to about 0.5 μm; and the outer layer has a thickness ranging from about 1 μm to about 4 μm.

11. The apparatus as defined in claim 7 wherein the substrate is selected from steel, steel compositions, aluminum, aluminum alloys, magnesium, magnesium alloys, and combinations thereof.

* * * * *